(12) United States Patent
Kishi et al.

(10) Patent No.: US 10,573,802 B2
(45) Date of Patent: Feb. 25, 2020

(54) MAGNETIC MEMORY DEVICE

(71) Applicant: TOSHIBA MEMORY CORPORATION, Minato-ku, Tokyo (JP)

(72) Inventors: Tatsuya Kishi, Seongnam-si (KR); Youngmin Eeh, Seongnam-si (KR); Kazuya Sawada, Seoul (KR); Masaru Toko, Kodaira (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/129,265

(22) Filed: Sep. 12, 2018

(65) Prior Publication Data

US 2019/0288184 A1    Sep. 19, 2019

(30) Foreign Application Priority Data

Mar. 19, 2018  (JP) .................. 2018-051232

(51) Int. Cl.
| | |
|---|---|
| *H01L 43/02* | (2006.01) |
| *G11C 11/16* | (2006.01) |
| *H01L 43/10* | (2006.01) |
| *H01F 10/32* | (2006.01) |
| *H01L 27/22* | (2006.01) |

(52) U.S. Cl.
CPC ............ *H01L 43/02* (2013.01); *G11C 11/161* (2013.01); *G11C 11/1675* (2013.01); *H01F 10/329* (2013.01); *H01F 10/3259* (2013.01); *H01F 10/3286* (2013.01); *H01L 27/228* (2013.01); *H01L 43/10* (2013.01)

(58) Field of Classification Search
CPC ......... H01L 43/02; H01L 43/08; H01L 43/10; G11C 11/14–16; G11C 11/161
See application file for complete search history.

(56) References Cited

U.S. PATENT DOCUMENTS

| 7,241,631 | B2 * | 7/2007 | Huai ..................... B82Y 25/00 257/295 |
|---|---|---|---|
| 7,602,591 | B2 | 10/2009 | Sbiaa et al. |
| 7,787,288 | B2 | 8/2010 | Kitagawa et al. |
| 9,105,832 | B2 * | 8/2015 | Buhrman ................ G11C 11/18 |
| 9,230,626 | B2 | 1/2016 | Buhrman et al. |
| 2007/0096229 | A1 * | 5/2007 | Yoshikawa ............. G11C 11/16 257/421 |

FOREIGN PATENT DOCUMENTS

| JP | 2007005803 A | 1/2007 |
|---|---|---|
| JP | 4250644 B2 | 4/2009 |
| JP | 5101298 B2 | 12/2012 |

* cited by examiner

*Primary Examiner* — Allison Bernstein
(74) *Attorney, Agent, or Firm* — Holtz, Holtz & Volek PC

(57) ABSTRACT

According to one embodiment, a magnetic memory device includes a stacked structure that includes a first magnetic layer having a variable magnetization direction, a second magnetic layer having a fixed magnetization direction, and a nonmagnetic layer provided between the first magnetic layer and the second magnetic layer, wherein the entire first magnetic layer exhibits a parallel or antiparallel magnetization direction to the second magnetic layer, and has an anisotropic magnetic field Hk_film within a range from −1 kOe to +1 kOe.

16 Claims, 6 Drawing Sheets

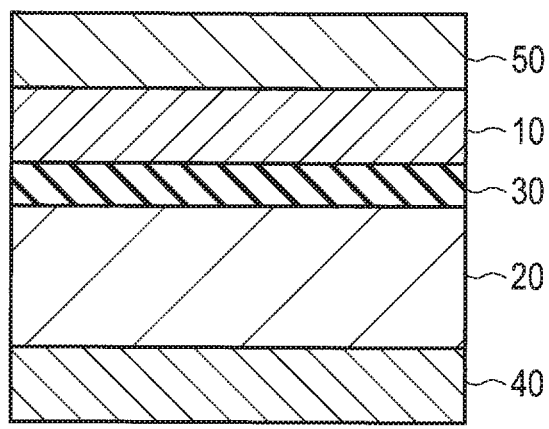
F I G. 2A
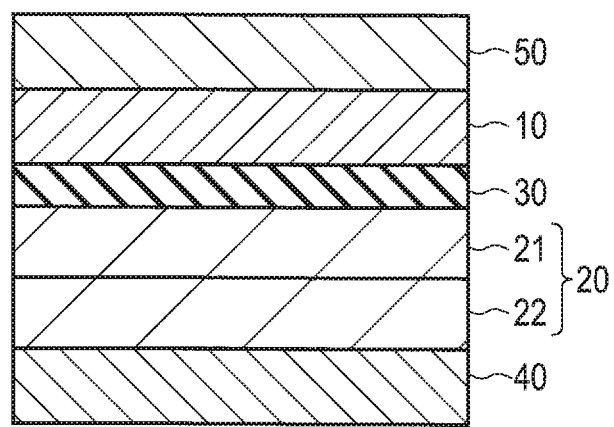
F I G. 2B

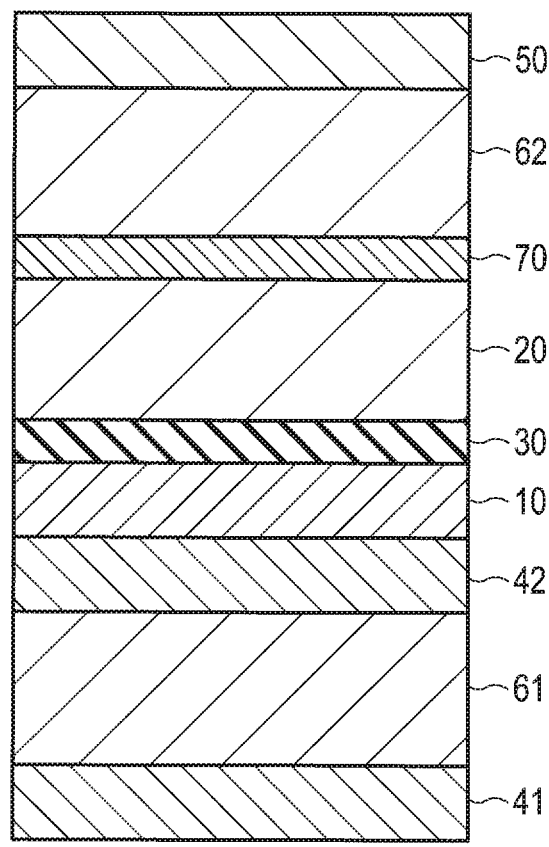
F I G. 5

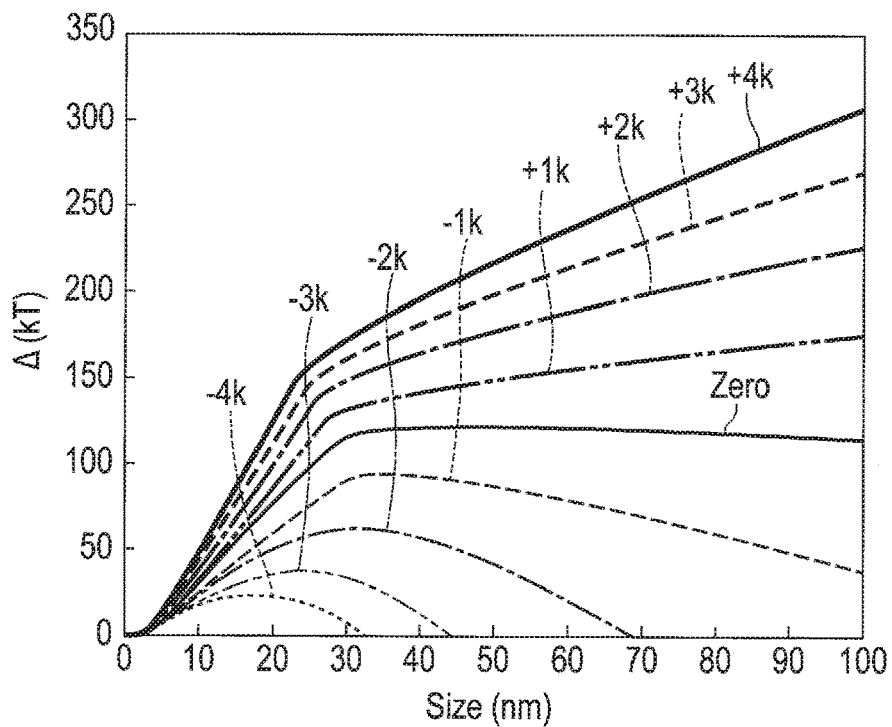
F I G. 6
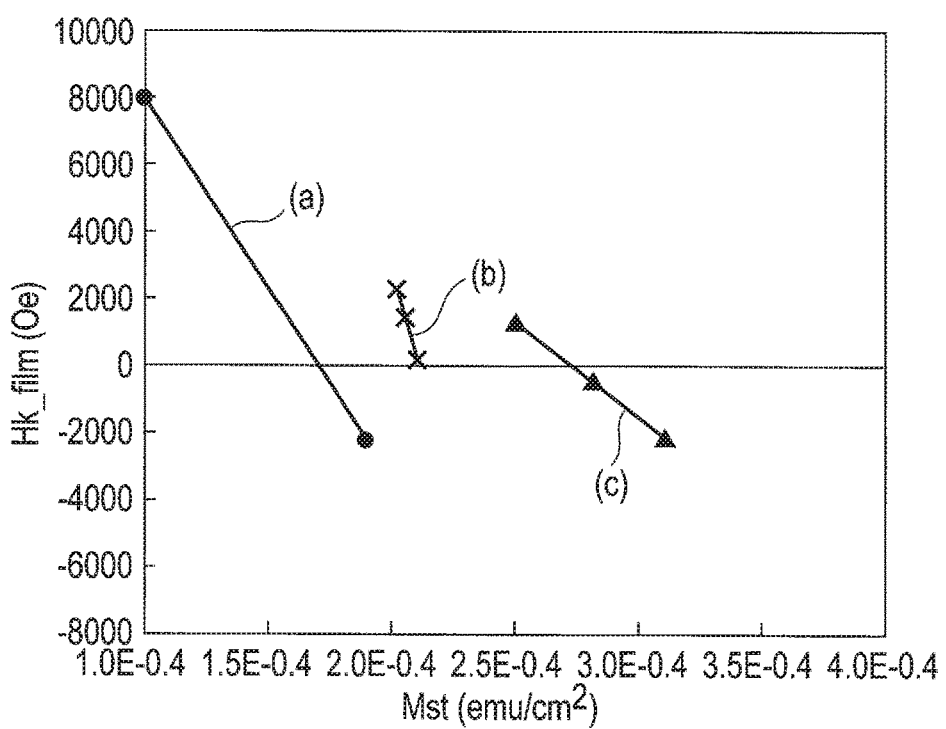
F I G. 7

MAGNETIC MEMORY DEVICE

CROSS-REFERENCE TO RELATED APPLICATIONS

This application is based upon and claims the benefit of priority from Japanese Patent Application No. 2018-051232, filed Mar. 19, 2018, the entire contents of which are incorporated herein by reference.

FIELD

Embodiments described herein relate generally to a magnetic memory device.

BACKGROUND

A magnetic memory device (semiconductor integrated circuit device) including a magnetoresistive element and a transistor that are integrated on a semiconductor substrate has been proposed.

In the magnetoresistive element, it is important to maintain high retention characteristics even when the element is formed minutely. However, when an attempt is made to maintain high retention characteristics, a write current may be increased.

Accordingly, there has been a demand for a magnetic memory device having high retention characteristics and capable of restricting increase in a write current.

BRIEF DESCRIPTION OF THE DRAWINGS

FIG. 2A is a cross-sectional view schematically showing a second configuration example of the magnetic memory device according to an embodiment;

FIG. 2B is a cross-sectional view schematically showing a variation of the second configuration example of the magnetic memory device according to an embodiment;

FIG. 5 is a cross-sectional view schematically showing a fifth configuration example of the magnetic memory device according to an embodiment;

FIG. 6 is a diagram showing a relationship between size of a magnetoresistive element and Δ when an anisotropic magnetic field (Hk_film) of a storage layer is varied;

FIG. 7 is a diagram showing a relationship between a magnetization amount (Mst) and an anisotropic magnetic field (Hk_film)

DETAILED DESCRIPTION

In general, according to one embodiment, a magnetic memory device includes a stacked structure that includes: a first magnetic layer having a variable magnetization direction; a second magnetic layer having a fixed magnetization direction; and a nonmagnetic layer provided between the first magnetic layer and the second magnetic layer, wherein the entire first magnetic layer exhibits a parallel or antiparallel magnetization direction to the second magnetic layer, and has an anisotropic magnetic field Hk_film within a range from −1 kOe to +1 kOe.

Hereinafter, description will be made on an embodiment with reference to the accompanying drawings.

Figure 1A:
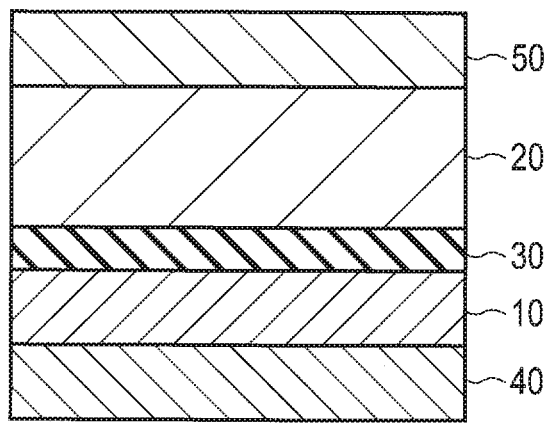
FIG. 1A is a cross-sectional view schematically showing a first configuration example of a magnetic memory device according to an embodiment.

FIG. 1A is a cross-sectional view schematically showing a first configuration example of the magnetic memory device according to an embodiment. Specifically, FIG. 1A is a cross-sectional view schematically showing a configuration of a magnetoresistive element included in the magnetic memory device. A magnetoresistive element is also called a magnetic tunnel junction (MTJ) element.

The magnetoresistive element is formed in a stacked structure including a storage layer (first magnetic layer) 10 having a variable magnetization direction, a reference layer (second magnetic layer) 20 having a fixed magnetization direction, a tunnel barrier layer (nonmagnetic layer) 30 provided between the storage layer 10 and the reference layer 20, an under layer 40 provided under the storage layer 10, and a cap layer 50 provided on the reference layer 20. That is, in the present configuration example, the under layer 40, the storage layer 10, the tunnel barrier layer 30, the reference layer 20, and the cap layer 50 are stacked in this order.

The variable magnetization direction means that a magnetization direction is changed with respect to a predetermined write current. The fixed magnetization direction means that a magnetization direction is not changed with respect to a predetermined write current.

The storage layer (first magnetic layer) 10 is a ferromagnetic layer, and has an anisotropic magnetic field Hk_film within a range from −1 kOe to +1 kOe. The entire storage layer 10 exhibits a parallel or antiparallel magnetization direction to the reference layer 20. The storage layer 10 is formed of a material containing iron (Fe), cobalt (Co), and boron (B). Specifically, the storage layer 10 is formed of FeCoB having a composition ratio of Fe:Co:B=9:1:2. The storage layer 10 may have a configuration in which a nonmagnetic metal layer is sandwiched between CoFeB layers (CoFeB layer/nonmagnetic metal layer/CoFeB layer). Metal elements used for the nonmagnetic metal layer include Ru, Ir, Os, Ta, W, Pt, Pd, and Mo. An alloy containing the above metal element may be used for the nonmagnetic metal layer.

The reference layer (second magnetic layer) 20 is a ferromagnetic layer, and formed of a material containing iron (Fe), cobalt (Co), and boron (B). Specifically, the reference layer 20 is formed of FeCoB.

Figure 1B:
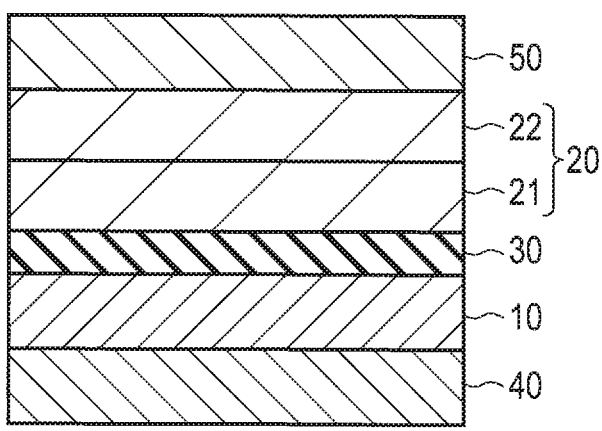
FIG. 1B is a cross-sectional view schematically showing a variation of the first configuration example of the magnetic memory device according to an embodiment.

As shown in FIG. 1B, the reference layer 20 may have a stacked structure including a first sub-magnetic layer 21 adjacent to the tunnel barrier layer 30 and a second sub-magnetic layer 22 separated from the tunnel barrier layer 30. In this case, the first sub-magnetic layer 21 is formed of a material containing iron (Fe), cobalt (Co), and boron (B). Specifically, the first sub-magnetic layer 21 is formed of FeCoB. The second sub-magnetic layer 22 is formed of a material containing cobalt (Co) and at least one element selected from platinum (Pt), nickel (Ni) and palladium (Pd). Specifically, the second sub-magnetic layer 22 is formed of CoPt, CoNi, or CoPd.

The tunnel barrier layer (nonmagnetic layer) 30 is an insulating layer containing magnesium (Mg) and oxygen (O). Specifically, the tunnel barrier layer 30 is formed of MgO.

The under layer 40 is formed of rare earth oxide, nitride (for example, aluminum nitride (AlN)), tungsten (W), magnesium oxide (MgO), tantalum (Ta), or the like.

The cap layer 50 is not particularly limited in the present configuration example as long as the cap layer 50 performs a function as the cap layer 50.

The magnetoresistive element selectively shows a parallel state in which a magnetization direction of the storage layer 10 is parallel to a magnetization direction of the reference layer 20 and an antiparallel state in which a magnetization direction of the storage layer 10 is antiparallel to a magnetization direction of the reference layer 20. A resistance of the magnetoresistive element in the parallel state is lower than that in the antiparallel state. Accordingly, the magnetoresistive element can store binary data (0 or 1) in accordance with resistance states (a low resistance state and a high resistance state).

The above magnetoresistive element is a magnetoresistive element of a spin transfer torque (STT) type, and has perpendicular magnetization. That is, a magnetization direction of the storage layer 11 is a direction perpendicular to a main surface of the storage layer 11, and a magnetization direction of the reference layer is a direction perpendicular to a main surface of the reference layer.

FIG. 2A is a cross-sectional view schematically showing a second configuration example of the magnetic memory device according to an embodiment. Specifically, FIG. 2A is a cross-sectional view schematically showing a configuration of the magnetoresistive element included in the magnetic memory device. Basic matters are similar to those in the first configuration example. Accordingly, matters described in the first configuration example will be omitted from description.

In the present configuration example as well, the magnetoresistive element is formed of a stacked structure including the storage layer 10, the reference layer 20, the tunnel barrier layer 30, the under layer 40, and the cap layer 50. Materials and the like of the storage layer 10, the reference layer 20, the tunnel barrier layer 30, and the under layer 40 are similar to those in the first embodiment. However, in the magnetoresistive element of the present configuration example, the under layer 40, the reference layer 20, the tunnel barrier layer 30, the storage layer 10, and the cap layer 50 are stacked in this order, and the cap layer 50 is formed of rare earth oxide.

As shown in FIG. 2B, in the second configuration example as well, the reference layer 20 may have a stacked structure including the first sub-magnetic layer 21 adjacent to the tunnel barrier layer 30 and the second sub-magnetic layer 22 separated from the tunnel barrier layer 30, like the first configuration example. In this case, a material similar to that in the first configuration example can be used for the first sub-magnetic layer 21 and the second sub-magnetic layer 22.

Figure 3:
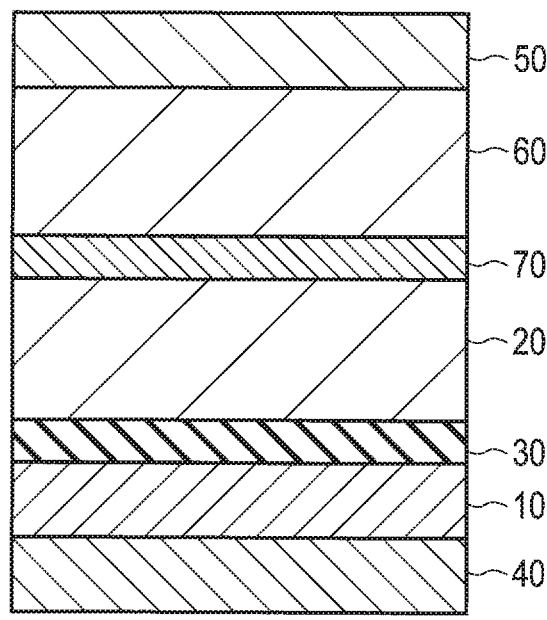
FIG. 3 is a cross-sectional view schematically showing a third configuration example of the magnetic memory device according to an embodiment.

FIG. 3 is a cross-sectional view schematically showing a third configuration example of the magnetic memory device according to an embodiment. Specifically, FIG. 3 is a cross-sectional view schematically showing a configuration of the magnetoresistive element included in the magnetic memory device. Basic matters are similar to those in the first configuration example and the like. Accordingly, matters described in the first configuration example will be omitted from description.

In the present configuration example, the magnetoresistive element is configured with the storage layer 10, the reference layer 20, the tunnel barrier layer 30, the under layer 40, the cap layer 50, a shift canceling layer 60, and a spacer layer 70.

The shift canceling layer 60 is formed of a material containing cobalt (Co) and at least one element selected from platinum (Pt), nickel (Ni) and palladium (Pd). Specifically, the second sub-magnetic layer is formed of CoPt, CoNi, or CoPd. The spacer layer 70 is formed of ruthenium (Ru), iridium (Ir), and the like.

Figure 4:
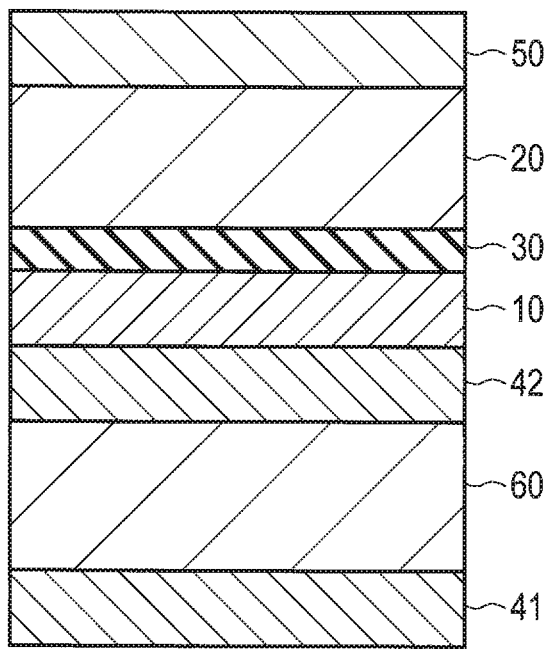
FIG. 4 is a cross-sectional view schematically showing a fourth configuration example of the magnetic memory device according to an embodiment.

FIG. 4 is a cross-sectional view schematically showing a fourth configuration example of the magnetic memory device according to an embodiment. Specifically, FIG. 4 is a cross-sectional view schematically showing a configuration of the magnetoresistive element included in the magnetic memory device. Basic matters are similar to those in the first configuration example and the like. Accordingly, matters described in the first configuration example and the like will be omitted from description.

In the present configuration example, the magnetoresistive element is configured with the storage layer 10, the reference layer 20, the tunnel barrier layer 30, under layers 41 and 42, the cap layer 50, the shift canceling layer 60.

FIG. 5 is a cross-sectional view schematically showing a fifth configuration example of the magnetic memory device according to an embodiment. Specifically, FIG. 5 is a cross-sectional view schematically showing a configuration of the magnetoresistive element included in the magnetic memory device. Basic matters are similar to those in the first configuration example and the like. Accordingly, matters described in the first configuration example and the like will be omitted from description.

In the present configuration example, the magnetoresistive element is configured with the storage layer 10, the reference layer 20, the tunnel barrier layer 30, the under layers 41 and 42, the cap layer 50, shift canceling layers 61 and 62, and the spacer layer 70.

As described above, the storage layer 10 of the magnetoresistive element of the present embodiment (the first configuration example and the second configuration example) has the anisotropic magnetic field Hk_film within a range from −1 kOe to +1 kOe. In this manner, a magnetic memory device having high retention characteristics and capable of restricting increase in a write current can be obtained. Hereinafter, detailed description will be made.

In the magnetoresistive element, it is important to maintain high retention characteristics even when the element is formed minutely. A mark Δ is used as an index of retention characteristics. To obtain excellent retention characteristics, a value of Δ is preferably large. However, there is a problem that, when an attempt is made to have Δ of a large value, a write current is increased. Accordingly, there has been a demand for high retention characteristics as well as restriction on increase in a write current.

The index Δ can be expressed by the following equation:

$$\Delta = \begin{cases} \dfrac{K_{u\_eff} V}{k_B T} & \text{for } D \leq D_S \\ \Delta(D = D_S)\left(\dfrac{D}{D_S}\right)^{0.67} & \text{for } D > D_S \end{cases}$$

where Ku_eff is magnetic anisotropy energy, V is volume, KB is a Boltzman constant, T is a temperature, D is size of the magnetoresistive element (size of the storage layer), and Ds is a diameter of a single domain of the storage layer.

The following equation is also established:

$$K_{u\_eff} = K_{u\_int} - 2\pi NMs^2$$

$$Hk\_film = Hk\_int - 4\pi M_s$$

$$K_{u\_int} = \frac{Hk_{int}Ms}{2}$$

$$Ds = \frac{6\sqrt{A_{ex}K_{u\_int}}}{K_{u\_int} - 2\pi(N_a - 1)Ms}$$

where Hk_int is an anisotropic magnetic field, Ku_int is anisotropy energy, Aex is exchange stiffness, N is a demagnetization factor, and Na is a demagnetization factor in z-direction (a function of size and a film thickness).

FIG. 6 is a diagram showing a relationship between size of a magnetoresistive element (size of the storage layer) and Δ when an anisotropic magnetic field (Hk_film) of the storage layer is varied. Hk_film is an anisotropic magnetic field of the storage layer of a solid film.

As shown in FIG. 6, the larger a value of the anisotropic magnetic field (Hk_film) is, the larger a value of Δ also becomes. Accordingly, from the point of view of retention characteristics, a value of the anisotropic magnetic field (Hk_film) may be preferably large. However, as described above, there is a problem that, when an attempt is made to have Δ of a large value, a write current is increased. Accordingly, in order to restrict increase in a write current and also restrict retention characteristics from becoming poorer, minimizing variation of Δ is considered to be preferable rather than increasing a value of Δ.

As shown in FIG. 6, when Hk_film=0, variation of Δ with respect to variation of size is smallest. Accordingly, in order to restrict increase in a write current and also restrict retention characteristics from becoming poorer, Hk_film=0 is preferable. However, within a range of −1 kOe<Hk_film<+1 kOe, it is possible to a certain extent to restrict increase in a write current and also restrict retention characteristics from becoming poorer. Accordingly, a storage layer that satisfies −1 kOe<Hk_film<+1 kOe is preferably provided.

FIG. 7 is a diagram showing a relationship between a magnetization amount (Mst) and an anisotropic magnetic field (Hk_film). A magnetization amount corresponds to a product of saturation magnetization Ms and a thickness t. A characteristic (a) and a characteristic (b) are characteristics in the first configuration example, and a characteristic (c) is a characteristic in the second configuration example. Specifically, the characteristic (a) is obtained when rare earth oxide is used for the under layer 40, FeCoB (Fe$_{90}$Co$_{10}$B$_{20}$, thickness of 2.8 nm) is used for the storage layer 10, and MgO is used for the tunnel barrier layer 30. The characteristic (b) is obtained when nitride is used for the under layer 40, FeCoB (Fe$_{90}$Co$_{10}$B$_{20}$, thickness of 1.3 nm) is used for the storage layer 10, and MgO is used for the tunnel barrier layer 30. The characteristic (c) is obtained when MgO is used for the tunnel barrier layer 30, FeCoB (Fe$_{90}$Co$_{10}$B$_{20}$, thickness of 1.3 nm) is used for the storage layer 10, and rare earth oxide is used for the cap layer 50.

As shown in the characteristic (a) and the characteristic (b), a ferromagnetic material containing iron (Fe), cobalt (Co) and boron (B) is used for the storage layer 10, an insulating material containing magnesium (Mg) and oxygen (O) is used for the tunnel barrier layer 30, rare earth oxide or nitride is used for the under layer 40, and a magnetization amount (Mst) of the storage layer is optimized. In this manner, −1 kOe<Hk_film<+1 kOe can be obtained. Tungsten (W), magnesium oxide (MgO), or tantalum (Ta) may be used for the under layer 40.

As shown in the characteristic (c), a ferromagnetic material containing iron (Fe), cobalt (Co) and boron (B) is used for the storage layer 10, an insulating material containing magnesium (Mg) and oxygen (O) is used for the tunnel barrier layer 30, rare earth oxide is used for the cap layer 50, and a magnetization amount (Mst) of the storage layer is optimized. In this manner, −1 kOe<Hk_film<+1 kOe can be obtained.

As described above, in the present embodiment, the entire storage layer 10 shows a parallel or antiparallel magnetization direction to the reference layer 20, and the storage layer 10 is formed of a material having an anisotropic magnetic field Hk_film within a range from −1 kOe to +1 kOe. In this manner, a magnetic memory device having high retention characteristics and capable of restricting increase in a write current can be obtained.

Figure 8:
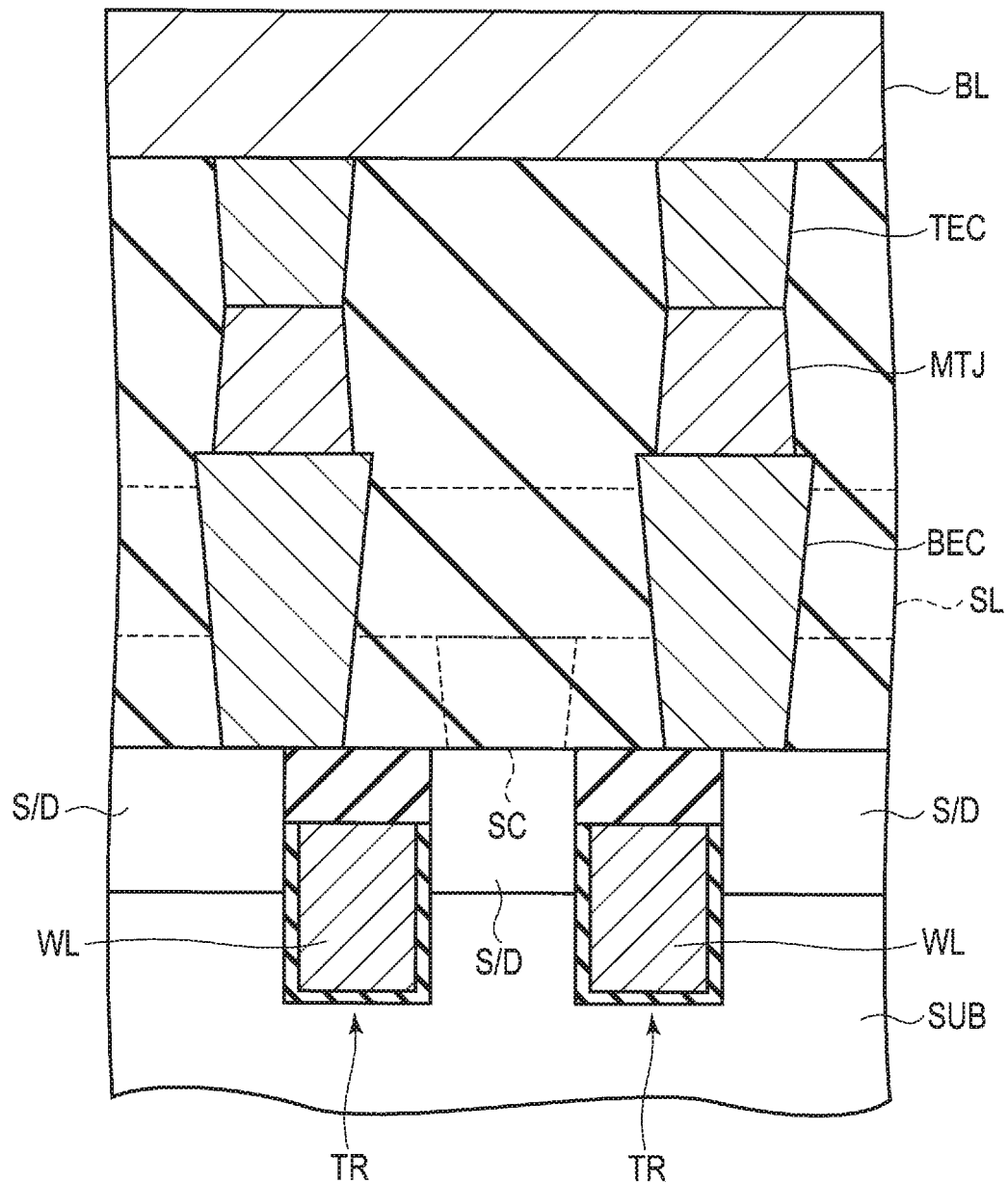
FIG. 8 is a cross-sectional view schematically showing a configuration of a magnetic memory device using a magnetoresistive element according to an embodiment.

FIG. 8 is a cross-sectional view schematically showing a configuration of a magnetic memory device (semiconductor integrated circuit device) using the magnetoresistive element.

An MOS transistor TR of a buried gate type is formed in a semiconductor substrate SUB. A gate electrode of the MOS transistor TR is used as a word line WL. A bottom electrode BEC is connected to one of source and drain regions S/D of the MOS transistor TR, and a source line contact SC is connected to the other one of the source and drain regions S/D.

A magnetoresistive element MTJ is formed on the bottom electrode BEC, and a top electrode TEC is formed on the magnetoresistive element MTJ. A bit line BL is connected to the top electrode TEC. A source line SL is connected to the source line contact SC.

By applying the above magnetoresistive element to the magnetic memory device shown in FIG. 8, an excellent magnetic memory device can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
    a bottom electrode;
    a top electrode; and
    a stacked structure provided between the bottom electrode and the top electrode and comprising:
        a first magnetic layer having a magnetization direction which is perpendicular to a main surface thereof and which is variable;
        a second magnetic layer having a fixed magnetization direction which is perpendicular to a main surface thereof;
        a nonmagnetic layer provided between the first magnetic layer and the second magnetic layer; and an under layer on which the first magnetic layer, the second magnetic layer, and the nonmagnetic layer are provided, wherein:

no magnetic layer is provided between the bottom electrode and the under layer, the under layer is formed of rare earth oxide, nitride, tungsten (W), magnesium oxide (MgO), or tantalum (Ta), and the entire first magnetic layer exhibits a parallel or antiparallel magnetization direction to the second magnetic layer, and has an anisotropic magnetic field Hk_film within a range from −1 kOe to +1 kOe.

2. The device according to claim 1, wherein the first magnetic layer contains iron (Fe), cobalt (Co), and boron (B).

3. The device according to claim 1, wherein the nonmagnetic layer contains magnesium (Mg) and oxygen (O).

4. The device according to claim 1, wherein the stacked structure comprises the under layer, the first magnetic layer, the nonmagnetic layer, and the second magnetic layer stacked in this order.

5. The device according to claim 1, wherein:

the stacked structure further comprises a cap layer, and the cap layer is provided on a structure comprising the first magnetic layer, the second magnetic layer, the nonmagnetic layer, and the under layer.

6. The device according to claim 5, wherein the cap layer is formed of rare earth oxide.

7. The device according to claim 6, wherein the stacked structure comprises the under layer, the second magnetic layer, the nonmagnetic layer, the first magnetic layer, and the cap layer stacked in this order.

8. The device according to claim 1, wherein the stacked structure further comprises a third magnetic layer having a fixed magnetization direction antiparallel to the magnetization direction of the second magnetic layer.

9. The device according to claim 1, wherein the stacked structure constitutes a spin transfer torque (STT) magnetoresistive element.

10. A magnetic memory device comprising:

a bottom electrode;

a top electrode; and a stacked structure provided between the bottom electrode and the top electrode and comprising:

a first magnetic layer having a magnetization direction which is perpendicular to a main surface thereof and which is variable;

a second magnetic layer having a fixed magnetization direction which is perpendicular to a main surface thereof;

a nonmagnetic layer provided between the first magnetic layer and the second magnetic layer; and a cap layer provided on a structure comprising the first magnetic layer, the second magnetic layer, and the nonmagnetic layer, wherein:

no magnetic layer is provided between the top electrode and the cap layer, the cap layer is formed of rare earth oxide, and an entirety of the first magnetic layer exhibits a parallel or antiparallel magnetization direction to the second magnetic layer, and the first magnetic layer has an anisotropic magnetic field Hk_film within a range from −1 kOe to +1 kOe.

11. The device according to claim 10, wherein the first magnetic layer contains iron (Fe), cobalt (Co), and boron (B).

12. The device according to claim 10, wherein the nonmagnetic layer contains magnesium (Mg) and oxygen (O).

13. The device according to claim 10, wherein:

the stacked structure further comprises an under layer, and the first magnetic layer, the second magnetic layer, the nonmagnetic layer, and the cap layer are provided on the under layer.

14. The device according to claim 10, wherein the stacked structure comprises the second magnetic layer, the nonmagnetic layer, the first magnetic layer, and the cap layer stacked in this order.

15. The device according to claim 10, wherein the stacked structure further comprises a third magnetic layer having a fixed magnetization direction antiparallel to the magnetization direction of the second magnetic layer.

16. The device according to claim 10, wherein the stacked structure constitutes a spin transfer torque (STT) magnetoresistive element.

* * * * *